United States Patent [19]

Ewing

[11] Patent Number: 5,325,267

[45] Date of Patent: Jun. 28, 1994

[54] REMOTE DRIVER BOARD HAVING INPUT/OUTPUT CONNECTOR CIRCUITRY MOLDED THEREIN

[75] Inventor: Joan R. Ewing, Fairport, N.Y.

[73] Assignee: Xerox Corporation, Stamford, Conn.

[21] Appl. No.: 981,732

[22] Filed: Nov. 25, 1992

[51] Int. Cl.⁵ .............................................. A05K 7/02
[52] U.S. Cl. ................................... 361/760; 361/729; 361/785; 361/810; 174/255; 174/261; 257/678; 439/55
[58] Field of Search ............... 361/393, 397, 400, 401, 361/409, 413, 417, 419, 420, 426, 8, 729, 736, 760, 761, 777, 785, 867, 809, 810; 174/255, 257, 261, 266; 257/678, 690, 692, 693, 786; 439/55, 44, 45, 31

[56] References Cited

U.S. PATENT DOCUMENTS

| | | | |
|---|---|---|---|
| 3,631,300 | 12/1971 | Humble | 317/122 |
| 4,206,962 | 6/1980 | Shue, Jr. et al. | 339/147 R |
| 4,558,397 | 12/1985 | Olsson | 361/404 |
| 4,607,170 | 8/1986 | Wickman | 307/147 |
| 4,609,241 | 9/1986 | Peterson | 339/17 CF |
| 5,037,308 | 8/1991 | Bryce et al. | 439/52 |
| 5,044,964 | 9/1991 | Minerd et al. | 439/67 |
| 5,138,528 | 8/1992 | Altman et al. | 361/400 |

OTHER PUBLICATIONS

Jerry Lyman, "Grooved Boards Challenge Conventional PC Boards", May 26, 1988, 77-78.

Offenlegungsschrift, German Patent No. 2,647,796, "Circuit Board, Especially a Circuit Board Designed as the Bottom of a Casing As Well As a Process for Producing Such Parts", Oct. 22, 1976.

Primary Examiner—Leo P. Picard
Assistant Examiner—Young Whang
Attorney, Agent, or Firm—R. Hutter

[57] ABSTRACT

A remote driver board suitable for creating electrical interconnections in a substantially wireless electrical apparatus such as a electrophotographic apparatus. A series of parallel conductors extend the length of one side of the board, and along the other side is disposed a modular connector and a switching device, such as in the form of an integrated circuit, for controlling connections between the parallel conductors to other electrical devices in the system through the modular connector.

20 Claims, 4 Drawing Sheets

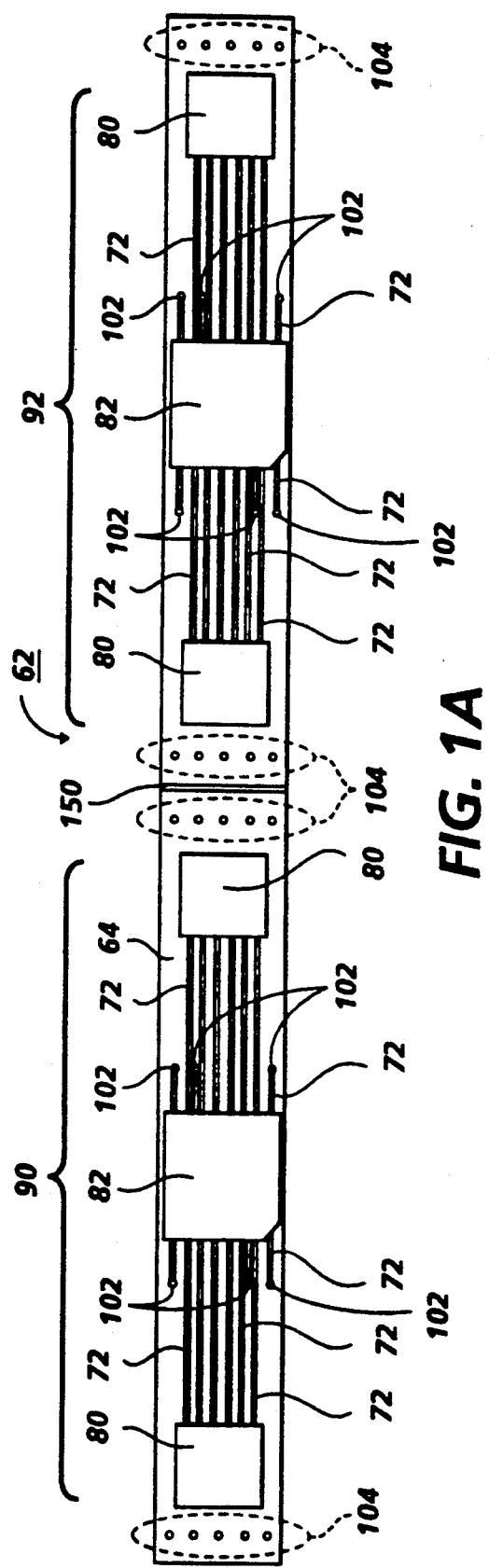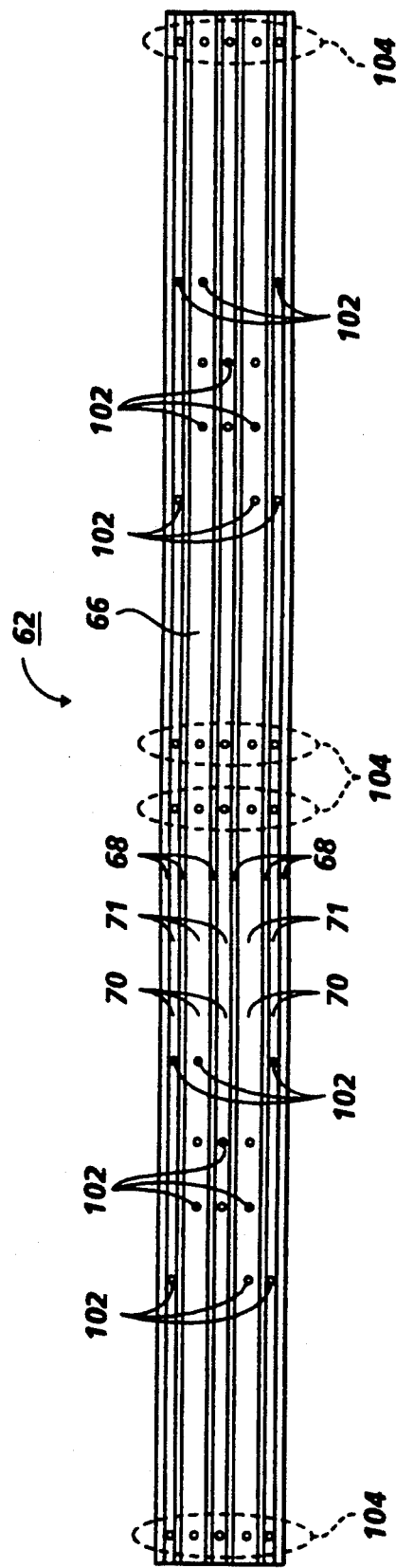
FIG. 1A
FIG. 1B

REMOTE DRIVER BOARD HAVING INPUT/OUTPUT CONNECTOR CIRCUITRY MOLDED THEREIN

BACKGROUND OF THE INVENTION

1. Field of the Invention

This invention relates generally to a remote driver board, and more specifically, to an improved remote driver board with modular characteristics, capable of being used in multiple locations without alteration of form, fit, or function. The remote driver board includes intelligent input/output connector circuitry molded therein, adapted for multi-level operation and multiplexing of input/output data.

The prior art discloses printed wire remote driver boards having integrated circuitry including connectors having a logic chip or circuitry within the printed wire board or in the connector itself. Such wire boards have a variety of applications. One application for such prior art wire boards is within an electrophotographic apparatus or machine.

Recently, in order to minimize maintenance costs by permitting the operator to replace worn out or exhausted processing units in electrophotographic apparatus, emphasis has been placed on incorporating one or more of the processing units of the apparatus in removable cartridges or units. The operator can readily remove each cartridge or unit when its operational life has been exhausted and insert a new cartridge. In addition, easier service and diagnostic access to internal subsystems of an electrophotographic machine can be achieved.

Within the electrophotographic apparatus, it is necessary to distribute power and/or logic signals between the various units, subsystems, and/or cartridges thereof. Traditionally, this has been accomplished utilizing conventional wires, wire boards (also referred to as printed circuit remote driver boards) and wiring harnesses in each machine to distribute power and logic signals between, for example, the central controller of the machine and a removable processing unit or electrical subsystem unit. A recent emphasis has been placed on replacing conventional wire boards and wire harnesses in copier products to achieve a so-called "wireless copier." Conventional wire boards and harnesses cause problems when replacing worn out or exhausted members within an electrophotographic machine. Such boards and harnesses may have to be handled or moved several times in making connections between wires of several different assemblies, circuit boards, or other members within the electrophotographic machine to install or replace one or more of the processing units therein. Handling of the wire connected thereto, as well as the boards and the harnesses, is a highly labor intensive task, frequently requiring routing of the several boards and harnesses through channels and around components manually. The manual connection can potentially result in human error in the installation, which might not otherwise occur if the use of automated, particularly robotic, installation could be employed. In addition, automated installation would reduce the high costs of labor involved in the manual installation. Also, such wire boards and harnesses are less than totally reliable in producing their intended function. Furthermore, and with increasing sophistication of capabilities of such products, a plurality of wiring boards and harnesses may be required in any individual machine which can require a large volume of space, thereby increasing the overall size of the machine.

Prior art wire board devices lack flexibility and present difficulty in extending the capability thereof without costly additions of hardware and redesign, such as a need to add an increasing number of interconnecting lines and customized boards. Other difficulties include the inability to carry different modes or levels of signals within the connector, to adapt the connector to different classes of input/output devices such as analog and/or digital, or inability to adapt to different configurations, such as variable input interfaces or output drivers. Yet, another difficulty with such prior art devices lies in the complicated and time consuming manual assembly and incorporation thereof into a desired machine. Accordingly, there is a desire to provide an alternative to the conventional wire boards to overcome these difficulties.

2. Description of the Prior Art

The following disclosures may be relevant to various aspects of the present invention:

Electronics, May 26, 1988, Pages 77-78, entitled "Grooved Boards Challenge Conventional PC Boards", by Jerry Lyman, is directed to molded circuit boards using three-dimensional circuitry. The molded circuit boards have grooves and sunken pads molded in. Metallization within the grooves provides an electrical path along both the sidewalls and the bottom of the groove. Molded recessed cavities can house entire devices. Fine-pitch component leads can be inserted into the grooves for assembly and soldering.

Co-pending U.S. patent application Ser. No. 07/808,697 discloses a grooved interconnect for electrically connecting two members having conductive traces on respective surfaces thereof. The interconnect includes first and second hinge parts of electrically insulating material which are mutually pivotable when placed in a mating position. The hinge parts have mutually contacting electrically conducting grooved portions when the first and second hinge parts are in their mating position, and the electrically conducting portion are in electrical contact with the conductive traces on the respective surfaces of the two members. The conductive traces are arranged on the two members such that when the members are secured, the conductive wiring aligns with the desired wires or traces on interconnected assemblies.

Co-pending U.S. patent application Ser. No. 07/812,336 discloses an interface connector device for interconnecting a plurality of input/output devices including a signal bus connected to a control for multiplexing the signals between the control and the input and output devices. A bus interconnects a plurality of interface and connector devices, and each of the interface and connector devices includes address recognition circuitry as well as programmable configuration selection logic to configure the connector device to respond to a variety of input/output devices.

U.S. Pat. No. 4,206,962 discloses an electrical connector having electronic components contained within the connector itself providing data transfer from closely spaced pin arrays to outside related equipment while providing a logic interconnect capability inside the connector itself.

U.S. Pat. No. 4,558,397 discloses an interposer connector for surface mounting of a ceramic chip to a printed wiring board. The connector comprises a dielectric base member having top planar surfaces and bottom surfaces formed as a series of rectangular projections with recesses therein. The U-shaped contact sections are mounted onto respective projections and have dimples disposed in the recesses, thus securing the terminals onto the projections.

U.S. Pat. No. 4,607,170 relates to an interface between data communications equipment and data terminal equipment and in particular discloses a pair of pin connectors having a housing and multiple pins and a multiple conductor cable interconnecting the pins in the connectors, and an active signal circuit enclosed within the housing of one of the connectors wherein the signal circuit includes means for generating a time or clock signal for timing or clocking the flow of data signals to the interconnection device.

U.S. Pat. No. 4,609,241 discloses a socket adaptable to the pin-out configuration of an integrated circuit. Printed circuit traces and plated through holes couple contacts on the first and second sides of a support member.

U.S. Pat. No. 5,037,308 discloses a programmable input/output connector module having a molded plastic base through which five bus wires extend. The molded base is equipped with channeled grooves into which five spring clips are housed and which makes contact with a corresponding bus wire at the bottom of the molded base.

U.S. Pat. No. 5,044,964 discloses a programmable connector module with a molded plastic base for mounting an IC chip. Tabs or punch holes located on the plastic base can be broken to disconnect an input circuit to the IC so that a logical 1 or 0, as desired, may be input into a terminal of the IC.

West German Offenlegungsschrift 2,647,796, to Zink, discloses a circuit board designed as the bottom of a casting which is produced by injection molding thermoplastic material so that the molded section has channels on the side for the printed wiring. Subsequent to injection molding, the thermoplastic material is activated and rendered electrically conductive and provided with a coating of a conductive material that forms the wiring traces. The circuit board has through holes which permit the insertion of wire therethrough connected to electrical components mounted on the opposite side (opposite the channeled wire trace side) thereof. The manufacturing process of the circuit board permits a high degree of automation, a three dimensional profile and the elimination of wiring operations.

SUMMARY OF THE INVENTION

According to the present invention, there is provided a modular remote driver board for providing electrical interconnections to an external electrical connector, in lieu of wire harnesses or custom driver boards. An elongated, electrically insulative base member is provided, having a first main side and a second main side and a first end and a second end. A plurality of substantially parallel conductors are disposed on the first main side, extending substantially along the length of the base member form the first end to the second end. At least one modular connection means is disposed on the second main side, the modular connection means being adapted to be removably connectable to an external electrical connector. A via in the base member forms an electrical connection between at least one conductor and the modular connection means.

BRIEF DESCRIPTION OF THE DRAWINGS

In the detailed description of the preferred embodiments of the present invention, reference is made to the accompanying drawings, in which:

FIG. 1A is a schematic top plan view of the remote driver board of the present invention;

FIG. 1B is a schematic bottom plan view of the remote driver board of the present invention;

Figure 2:
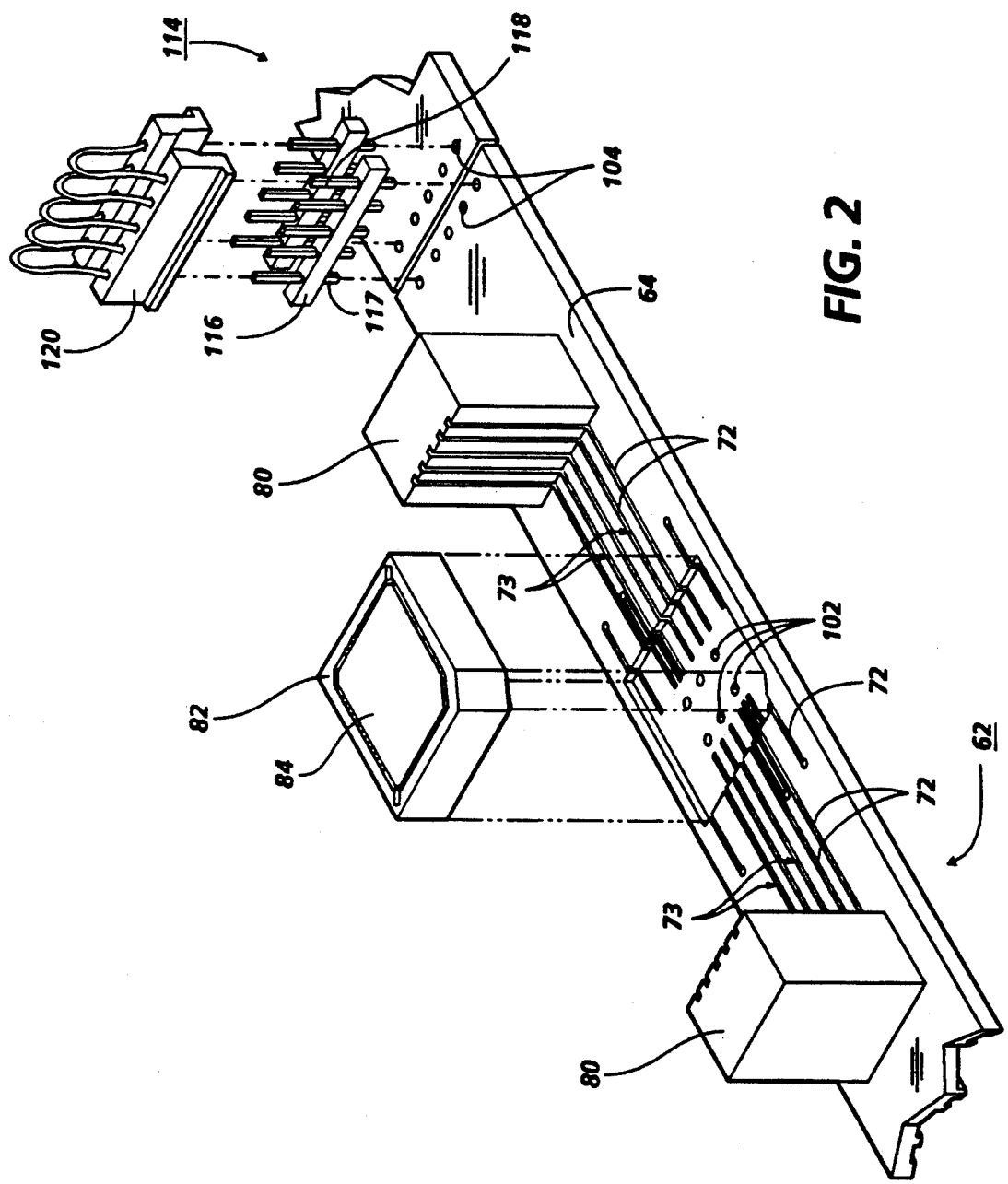
FIG. 2 is a schematic perspective view of the remote driver board of the present invention and an associated electrical interconnect, in which an integrated circuit chip, and a plurality of electrical device connectors are shown aligned axially above the remote driver board to illustrate their respective detachable mounting to the remote driver board.

In the drawings and the following description, it is to be understood that like numeric designations refer to components of like function.

Although specific terms are used in the following description for the sake of clarity, these terms are intended to refer only to the particular structure of the invention selected for illustration in the drawings, and are not intended to define or limit the scope of the invention.

DETAILED DESCRIPTION OF THE INVENTION

Turning to the specific subject matter of the present invention, with reference to FIGS. 1A and 1B, there is illustrated the two main sides of a wireless remote driver board 62 in accordance with the present invention. The body of the remote driver board 62 is a member formed of an insulative material. Preferably, the remote driver board 62 is produced from a thermoplastic material by injection molding in a single operation. The remote driver board 62 includes a first side 66 and a second side 64. Side 66 has defined thereon, in this embodiment, six ribs 68. Each adjacent rib forms a groove 70 disposed between the upstanding sides of the ribs 68 such that the six ribs 68 form five grooves 70. Within each groove 70 and on the upstanding sides of the ribs 68 is a metallic coating forming a conductor 71, made of a material such as copper. The electrically conductive material, extending end to end on the side 66 of the remote driver board 62, thus forms an electrically conductive path across the full extent of side 66. The remote driver board 62 can, therefore, conduct electricity from one electrically conducting member connected thereto at one end to another electrically conducting member thereto at another end. Thus, a series of adjacent modular remote driver boards 62 can be electrically interconnected in an effective straight-line succession to form a remote driver board assembly. The number of ribs 68 and grooves 70 can be any desired number and the numbers six and five are for descriptive and illustrative purposes only.

Figure 3:
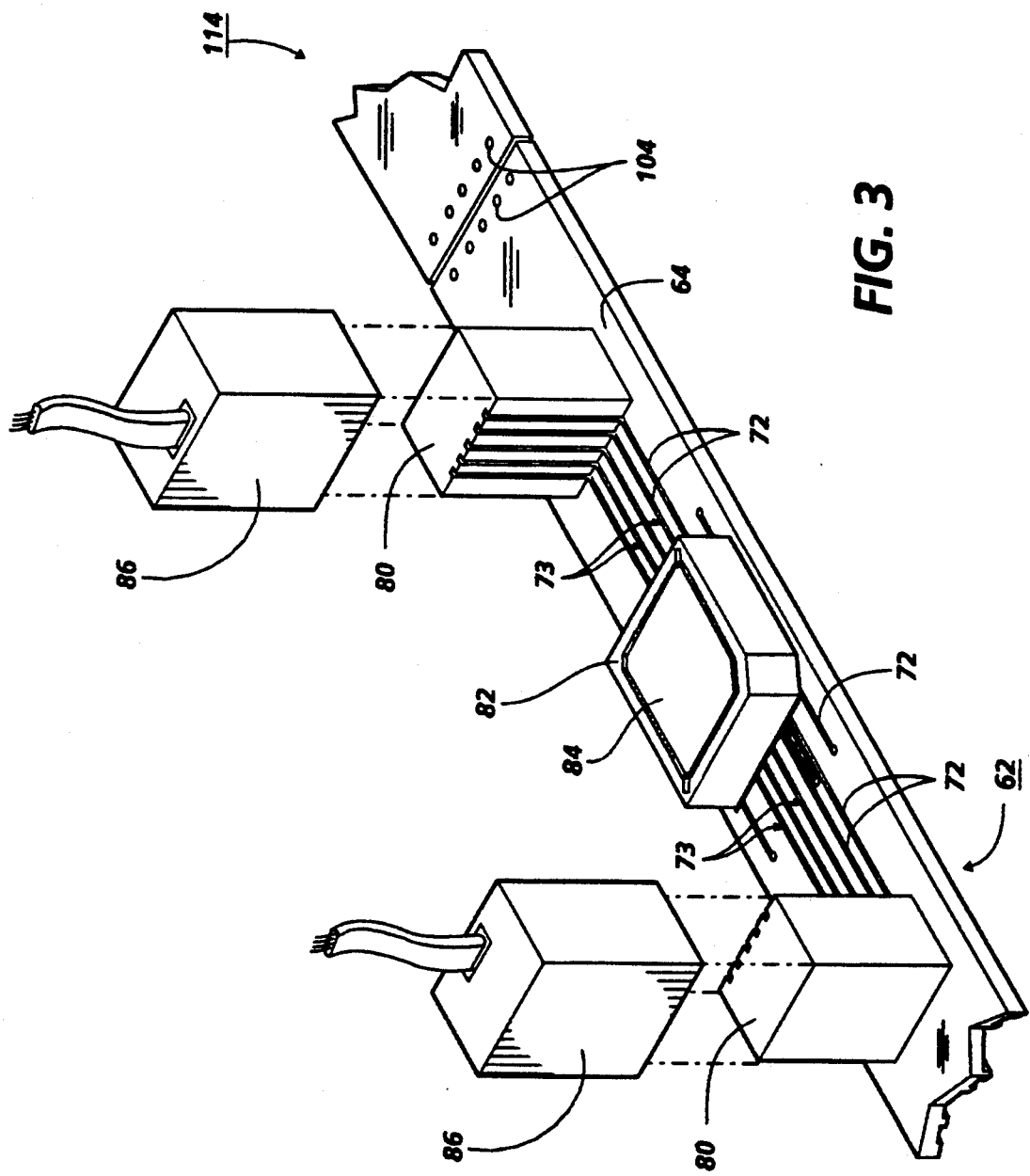
FIG. 3 is a schematic perspective view of the remote driver board of the present invention and the associated electrical interconnect, similar to FIG. 2, in which the integrated circuit chip socket is shown mounted to the remote driver board.

Referring now to FIGS. 2 and 3 as well, side 64 of remote driver board 62 defines at least one electrical device connector, such as connector protrusions or plugs 80. Preferably, each remote driver board 62 has two groups of one or more electrical device connectors, each controlled by at least one integrated circuit chip. For example, as illustrated in FIG. 1A, there is an adjacent first electrical device control group 90 and second electrical device control group 92 on the side 64. Socket 82, which houses a control chip which is protected by cover 84, and respective pairs of associated plugs 80, form the first electrical device control group 90. The second electrical device control group 92 consists of an equivalent set of components, which function in the same manner as previously understood with respect to the socket 82, and plugs 80. Side 64 further includes a plurality of projections and grooves 72, holding conductive leads 73, on the inner surface thereof. Within each groove, a coating of a metallic conductor, such as copper, is placed thereon to form a lead 73 in the same manner as on side 66. Each of the electrical device control groups 90 and 92 on the side 64 receive electrical current from the conductors 71 on the second side 66 through vias 102 and leads 73 in grooves 72 on side 64 to provide current to operate the electrical components of the control groups 90 and 92, as will be explained in detail below.

The location of the recess 74 for the socket 82 on the remote driver board 62 provides a "nerve center" in which each lead 73 on side 64 has an end thereof originating from the recess 74. The leads 73 extend outward from the recess 74 through grooves 72 to various locations on the remote driver board 22. The leads 73 provide conductive paths on side 64 between the control chip within socket 82 and at least two connector plugs 80, through which they may be operatively connected to other machine components.

The groups of vias 102 and through-holes 104 through the body of driver board 62 provide electrically conductive passageways between the leads 73 in grooves 72 on side 66 and the conductors 71 on side 64 (and thereby, to and from the respective control groups 90 and 92 on side 64). As used in the present application, 102 shall denote vias through the body of remote driver board 62 which may be solid in cross-section, and the reference numeral 104 shall denote plated through-holes defining an aperture therein, for example to accommodate the insertion of an external pin, as will be described below. Vias 102 may include apertures therethrough as well, because such hollow structures through the board may be relatively easy to create using metal plating techniques, but as used herein are not intended to accept any external member. In the illustrated embodiments, the particular placements of vias 102 and through-holes 104 relative to other parts of the remote driver board 62 are shown as examples only, and particular designs may mandate the placement of vias 102 and through-holes 104 in various locations as needed. The vias 102 may be used to create connections between conductors 71 and leads 73 as needed, or may be used to connect conductor 71 directly to a control chip in socket 82, as needed. The ends of vias 102 shown within recess 74 in FIG. 2 are given as examples of possible locations of the vias 102 relative to a control chip in a socket 82; alternatively all of the vias may be connected to leads such as 73.

Generally, the first electrical device control group 90 and the second electrical device control group 92 are electrically isolated from each other across the face of side 64. If desired, further grooves and leads (not shown) can be formed on side 64 to provide an electrically conductive path between the first electrical device control group 90 and the second electrical device control group 92. However, both control groups 90 and 92 are electrically connected to the conductors 71 formed on side 66.

The illustrative modular remote driver board 62 has a generally rectangular shape having a relatively large length to width ratio. While the shape can be configured to any desired, there are advantages to the long narrow shape shown. It is particularly useful for the multiplexed bus concept wherein the bus is made to come as close as possible to the electrical device or subsystem which is to be connected to it. This shape allows the driver board or bus to be efficiently extended around the machine or passed through a cross section without waste of material. It thus replaces the long length of wire harness or cable that would otherwise be used. In addition, the driver board offers, as will be seen later, integral connection and signal processing/addressing means through the integrated circuit chip and molded features. The board is also shaped and sized to fit against another device or component of a machine, such as a frame member, so as to enable more efficient use of space in a machine. The five conductor embodiment shown in the Figures is preferably about 30 millimeters wide. The length is clearly a function of the size of the machine, and it would be desirable to be able to easily change the length to suit the application. This is done by having standardized short lengths which can be connected in series to form an assembly much like sections of a railroad track. Each section or unit modular driver board will in general have at least one integrated circuit chip and provision for external connection of an input/output device by means of a short jumper cable with a connector 86 which mates with the connector plug 80 provided on the board, as will be explained below.

Molded circuit board technology is particularly useful for a modular remote driver board. While such a board can be fabricated from the more conventional copper foil laminated to epoxy-fiberglass substrates and patterned by etching, such boards have to have all components and connectors added as separate parts, which is labor intensive. It is an aspect of this invention to provide a remote driver board which needs only the chip socket and chip mounted to make it functional. This is enabled by molded recesses, grooves, connector protrusions, and vias.

After the grooves 70, 72 and recesses 74 are molded, the conductors 71 and leads 73 can be formed in the grooves by a number of means. The entire surface of the remote driver board 62 can be coated by immersing the insulative body within an electroplating bath. Preferably, the exterior surface where it is desirable to maintain electrical conductivity, i.e., within each groove 70 (or in other words on the upstanding sidewalls of the ribs 68 and the lower surface disposed therebetween), is then further treated with a print of material that is resistant to etching. The exterior surface where it is desirable to have an insulative surface exposed, i.e., the top surface of the ribs 68, can then be etched by immersing the remote driver board 62 into an etching bath which removes the unprinted areas.

Alternatively, the insulative body of the remote driver board 62 can be treated with a lacquer which is applied to only the elevated surfaces, i.e., to the top exterior surfaces of the ribs 68 where it is desirable to have an insulative surface exposed. The selected lacquer should function to prevent the treated areas from accepting a metal coating in a subsequent electroplating process. The selected lacquer may be applied by any desirable means including by means of a mold stamp whose elevated surfaces correspond approximately to the elevated projected surfaces of the remote driver board 62.

The purpose of the placement of metallic coating in the grooves 70 is to provide an electrical path in the grooves 70 along both the upstanding sidewalls of the ribs 68 and the bottom surface disposed between the upstanding sidewalls. The coating forming the conductors 71 should allow as much as five to fifteen times the amount of metallization per unit of surface area as ordinary board technology.

The grooves 72 on side 64 are relatively smaller than the grooves 70 on side 66, although if desired, both the grooves 70 and 72 can be of uniform size and conduct equal amounts of current. The grooves 72 on side 64 preferably have dimensions of 0.050" deep, spaced on 0.040" centers, with 0.020" walls for the best mating with the chip socket 82. Conductors 71 are greater in size and conductivity than leads 73 because the conductors 71 are required to conduct greater amounts of electricity serially to the various devices and subsystems (small groups of devices) of the entire machine or system, while the leads 73 function to provide current or control data to an individual device or subsystem.

Figure 4:
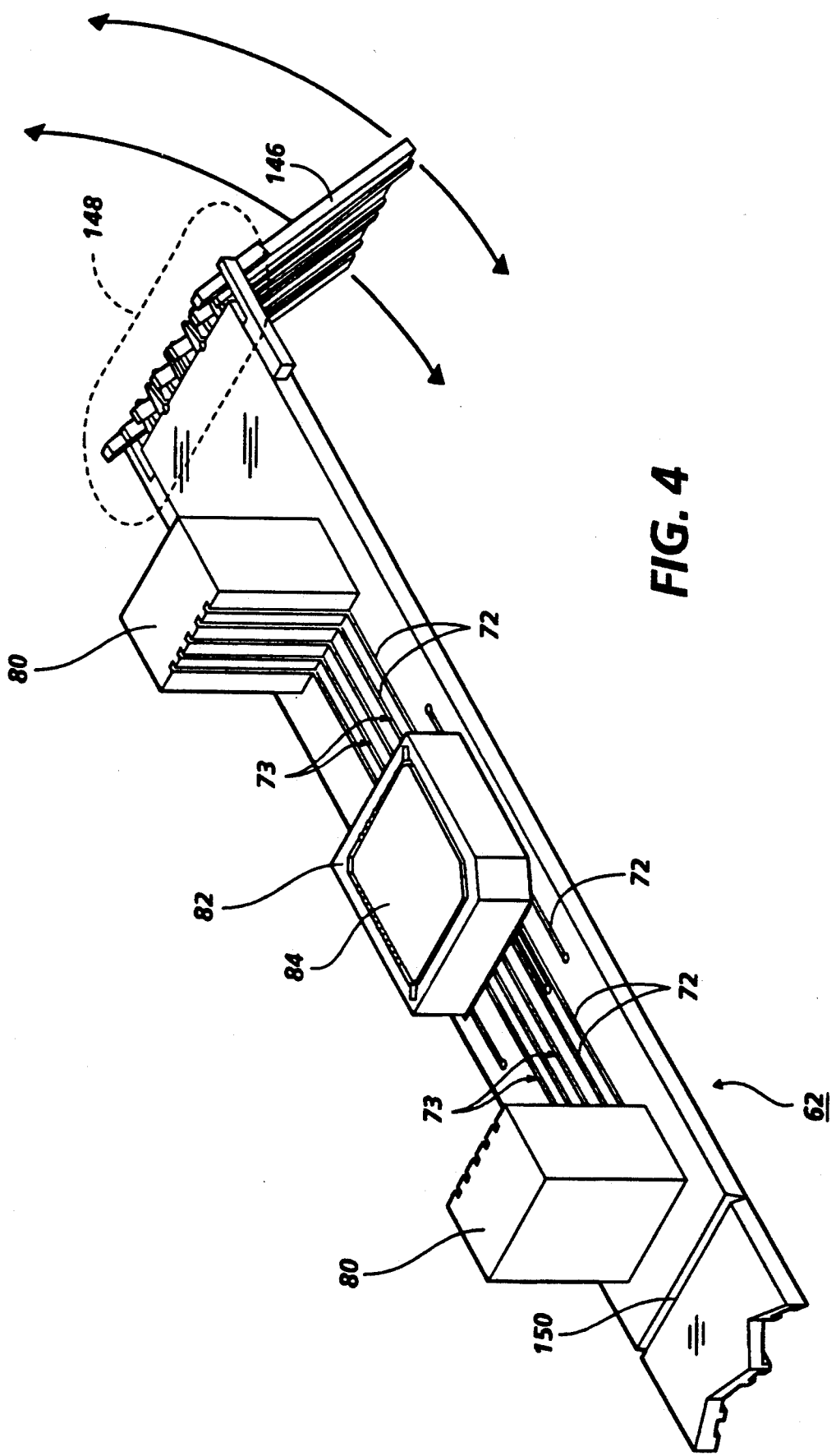
FIG. 4 is a schematic perspective view of the remote driver board of the present invention and an associated pivoting electrical interconnect.

Side 64 of the modular remote driver board 62 includes at least one recess 74. The recess is adapted to receive an electrical component therein and the grooves integral with the recess provide an electrically conductive path between the electrical component and the remote driver board 62. FIGS. 3 and 4 illustrate the remote driver board 62 having the socket 82 positioned within the recess 74, while FIG. 2 illustrates the socket 82 aligned for positioning within the recess 74. Operatively disposed within socket 82 is a control chip, which is preferably in the form of an integrated circuit.

The two connector protrusions, or plugs, 80 extending from side 64 of driver board 62 on either side of recess 74 are the means for connecting input or output devices to the driver board. The protrusions are preferably in a form which can be mated with female modular telephone connectors, such as those shown as 86 in FIG. 3. The protrusion resembles a typical male "phone plug," but need not have metal inserts or a free end attached to a cable. Instead, the protrusion is integrally molded with the board (i.e. the protrusion and the board are one piece), and grooved in the same manner as the male telephone connector. The interior of the grooves is continuous with and plated in the same manner as the leads 73 in the grooves 72 on the driver board. The conductive plating in the grooves in the plugs 80 thus form conductive traces which not only are adapted to interact with conductive leads within the female modular telephone connectors 86, but which also are electrically connected by leads 73 to the input/output terminals of the integrated circuit chip. Because of the construction of the traces in the grooves in plugs 80, the traces can be created in the same plating step as the leads 73, with which they form a continuous plated groove extending down the length of the remote driver board and along the plug 80. The female telephone connector is attached by means of a short cable to the input or output device. Latching means, as are familiar in phone plugs, may also be provided to prevent accidental disconnection.

In the preferred embodiment of the present invention, certain of the leads 73 are operatively connected to certain of the parallel conductors 71 on side 66 through certain of the vias 102 through the body of the remote driver board 62. In this way, data or other electrical signals on any of the conductors 71 are transmitted to the control chip within socket 82. Each control chip is electrically or mechanically programmed to have an address and the multiplexed signal is encoded to allow each control chip to separate the data addressed to it. The multiplexed signal is thus delivered to a number of control chips connected in series along a common bus. The common bus and the serial arrangement thus lend themselves to the construction of an elongated drive board with parallel bus conductors on one side and individual and equivalent "nerve centers" or control chips with input/output connection means on the other side.

Each plug 80 electrically connects the remote driver board 62 to one or more electrically operated or controlled devices which may function within the machine or system in which the remote driver board 62 is to function. For example, if the remote driver board 62 is to function within an electrophotographic apparatus, either of the plugs 80 may be electrically connected to a relay, sensor, motor, display device or a variety of other electrically operated or controlled devices.

Also shown in FIG. 2 is a "header," generally indicated as 116, which as shown includes a set of solid conductors or pins mounted to form short ends 117 and long ends 118. At the end of the driver board 62, indicated as 114 in FIG. 2, is another set of through holes 104, which facilitate connections between an array of pins or a header to the conductors on side 66 (the side not visible in FIG. 2) of driver board 62. The header 116 may be a separate unit or short pins may be individually inserted in the holes 104. The header is typically soldered to the driver board. The header allows the driver board 62 to be connected to a second driver board by means of a short jumper cable with two mating connectors 120. These jumpers allow a number of standard length driver boards to be connected so as to extend the bus conductors to all the input and output devices that require it and at the same time allows the assembly to go around corners because of the flexibility of these jumpers. Short ends 117 are configured to fit into the through-holes 104 at end 114 of driver board 62. Header 116 may conceivably be formed in one piece with driver board 62 with ends 117 being permanently connected to the conductor 71 of driver board 62. In a preferred embodiment for prototype applications, header 116 is purchased as a separate unit, and the short pins 117 are inserted through through-holes 104 and soldered to the conductors in driver board 62.

When the header 116 is installed at the end of a driver board 62, the long pins 118 extend outward from the board. Although the long pins 118 are shown in FIG. 2 as extending perpendicularly from the driver board 62, it is conceivable that the long pins 118 may be bent to be parallel to the driver board 62 through most of their length. Long pins 118 are then adapted to be inserted into a terminal housing 120, which may be of a type which is currently available, such as the "Molex®" 5197 crimp terminal housing. Typically, this terminal housing 120 is connected to parallel lines of wires, as shown, for connection elsewhere in the system. In a preferred use of the driver board of the present invention, one terminal housing 120 may be connected by short wires to a corresponding linear housing, which in turn connects to another driver board, as shown, to create the effect of doubling the length of a driver board 62; the two driver boards connected in parallel in this fashion will be the electronic equivalent of a single double-length board.

Also visible in FIG. 1B and in FIG. 4 is a groove 150 disposed across the side 64 of driver board 62. The purpose of groove 150 is to provide a frangible breaking-point along the length of the driver board 62, so that, in applications wherein less than a full length of a driver board 62 is required, or if it is necessary for a board to go around a corner when it is mounted in an apparatus, an existing board 62 may be simply broken off or "hinged" as needed to fit into a particular space. Such a feature is particularly useful in, for example, prototype models, or laboratory demonstration models, although they may also be used in a mass-production context. Preferably, a groove 150 should be disposed very close to a row of through-holes 104, which are adapted for external connection to other electrical components. Thus, when a board such as 62 is broken along groove 150, the conductor 71 near the groove 150 may be easily connected to a flexible jumper. Although the embodiment shown in FIG. 1B shows groove 150 forming a frangible break in board 62, other structures for deliberately weakening the board 62 at a predetermined location along the length thereof would also be apparent to one skilled in the art, such as small perforations defined in board 62.

Illustrated in FIG. 4 is a pivoting electrical interconnect 128. The pivoting electrical interconnect provides greater flexibility in positioning interconnected remote driver boards 62 by providing a wide range of angles in addition to 90 or 180 degrees. The hinge 148 connects the hinged portion 146 to the main portion of driver board 62. The pivoting electrical interconnect thus provides an electrically conductive path allowing electrical current to pass from traversely disposed remote driver boards 62 connected to opposite ends thereof. Examples of electrical interconnects are described in Co-pending U.S. patent application Ser. No. 07/808,697 to Swift et al., filed Dec. 17, 1991, the relevant portions of which are incorporated herein by reference thereto.

The general layout of the remote driver board of the present invention may be exploited within a large electrical system as follows. Within a relatively complicated electrical apparatus, such as a high-speed, high-volume electrophotographic printer or copier, the various subsystems of the apparatus, such as the paper feeding apparatus, print engine, developer apparatus, etc. may each interface with a central control through one or more control groups such as 90 or 92, along one or more remote driver boards 62. The exact point of interface for each sub-system will be through one of the male connectors 80. The one or more remote driver boards 62 may be arranged electrically end-to-end, as with the header arrangement described above, to effectively form a single five-wire bus formed by the continuous connectors 71 over several remote driver boards 62. This single five-wire bus may include, for example, a serial input data line, a serial output data line, a clock line, a positive voltage line (such as +5 volts), and a ground line. This five-wire bus may then interface with each of the remote sub-systems through one control group such as 90 or 92 on one board 62, and one sub-system (such as a control panel) may address other sub-systems as needed through the five-wire bus. In brief, control of the data flows along the five-wire bus as data thereon interacts with a plurality of remote stations may be accomplished by controlling the associated control chip 84 associated with each group such as 90 or 92, which is operatively disposed between the subsystem and the five-wire bus. Generally such a system for addressing various subsystems on a common bus is known as an input/output interface system, and one example of which may be seen in co-pending U.S. patent application Ser. No. 07/812,336, filed Dec. 23, 1991, the relevant portions thereof being incorporated herein by reference. The operation of an integrated circuit to function as an control chip such as 84 in such a system will be apparent from the above-referenced application, and variations thereof which may advantageously utilize the remote driver board of the present invention will be apparent to a person skilled in the art.

While this invention has been described in conjunction with a specific embodiment thereof, it is evident that many alternatives, modifications, and variations will be apparent to those skilled in the art. Accordingly, it is intended to embrace all such alternatives, modifications and variations that fall within the spirit and broad scope of the appended claims.

What is claimed is:

1. A remote driver board for providing electrical interconnections to an external electrical connector, comprising:
 an elongated, electrically insulative base member, having a first main side and a second main side and a first end and a second end;
 a plurality of parallel conductors disposed on the first main side, extending along the length of the base member from the first end to the second end;
 modular connection means, disposed on the second main side and connectable to the external electrical connector; and
 a via forming an electrical connection between one of the plurality of conductors and the modular connection means.

2. The driver board as in claim 1, further comprising switching means operatively disposed between one of the plurality of conductors and the modular connection means.

3. The driver board as in claim 2, wherein the switching means comprises an integrated circuit.

4. The driver board as in claim 2, wherein the switching means is disposed on the second main side of the base member.

5. The driver board as in claim 4, further comprising a lead, disposed on the second main side, forming a connection between the switching means and the modular connection means.

6. A remote driver board for providing electrical interconnections to an external electrical connector, comprising:
 an elongated, electrically insulative base member, having a first main side and a second main side and a first end and a second end;
 a plurality of parallel conductors disposed on the first main side, extending along the length of the base member from the first end to the second end;
 modular connection means, disposed on the second main side and connectable to the external electrical connector;
 a via forming an electrical connection between one of the plurality of conductors and the modular connection means;

switching means, disposed on the second main side of the base member and operatively disposed between one of the plurality of conductors and the modular connection means; and a lead, disposed on the second main side, forming a connection between the switching means and the modular connection means, wherein the second side of the base member defines a groove having the lead disposed therein.

7. The driver board as in claim 6, wherein the first side defines a plurality of grooves, with a conductor being disposed within each groove.

8. The driver board as in claim 6, wherein one of the plurality of conductors defines an aperture adapted to accept a pin associated with an external connector.

9. The driver board as in claim 8, further comprising an aperture defined in the base member coextensive with the aperture defined in the conductor.

10. The driver board as in claim 9, wherein a portion of the base member defining the aperture includes a conductive material.

11. The driver board as in claim 6, further comprising means for forming a frangible break point along the length of the base member.

12. The driver board as in claim 11, wherein one of the plurality of conductors defines the aperture adjacent the frangible break point of said forming means.

13. The driver board as in claim 6, wherein the base member includes a hinge formed therein, and wherein the parallel conductors form electrical connections across the hinge.

14. The driver board as in claim 6, wherein the modular connection means is a connector protrusion defining a groove therein, the groove including a conductive trace therein.

15. The driver board as in claim 14, further comprising a conductive lead defined in the second main side, adapted to form an electrical connection between the conductive trace in the connector protrusion and the switching means.

16. The driver board as in claim 15, wherein a conductive trace within a groove in the connector protrusion is continuous with the conductive lead defined in the second main side.

17. A driver board for providing electrical interconnections to an external electrical connector, comprising:

an electrically insulative base member;

a conductive lead defined on a surface of the base member;

a connector protrusion disposed on the surface of the base member and connectable to the external electrical connector, the connector protrusion defining a groove therein, the groove including a conductive trace therein, the conductive trace being continuous with the conductive lead.

18. The driver board as in claim 17, wherein the connector protrusion is one piece with the base member.

19. The driver board as in claim 17, wherein the conductive trace and the conductive lead are formed in a single plating operation.

20. A driver board for providing electrical interconnections to an external electrical connector, comprising:

an electrically insulative base member;

a conductive lead defined on a surface of the base member; and a connector protrusion disposed on the surface of the base member and connectable to the external electrical connector, the connector protrusion defining a groove therein, the groove including a conductive trace therein, the conductive trace being continuous with the conductive lead, wherein the base member defines a groove therein, and the conductive lead is disposed in the groove defined in the base member.

* * * * *